(12) United States Patent
Jackson et al.

(10) Patent No.: US 9,578,765 B2
(45) Date of Patent: Feb. 21, 2017

(54) HOLE PLUG DEVICE

(75) Inventors: Michael Jackson, Belding, MI (US);
Ramesh Rajagopal, Chennai (IN)

(73) Assignee: Robroy Industries, Inc., Verona, PA (US)

( * ) Notice: Subject to any disclaimer, the term of this patent is extended or adjusted under 35 U.S.C. 154(b) by 2587 days.

(21) Appl. No.: 12/179,725

(22) Filed: Jul. 25, 2008

(65) Prior Publication Data

US 2010/0018737 A1 Jan. 28, 2010

(51) Int. Cl.
*H05K 5/02* (2006.01)

(52) U.S. Cl.
CPC ...... *H05K 5/0239* (2013.01); *Y10T 29/49826* (2015.01)

(58) Field of Classification Search
CPC .. H05K 5/0239; B65D 39/084; B65D 39/082; B65D 39/08; B65D 41/083; B21D 51/40; B21D 51/50
USPC .............................................. 52/514; 220/288
See application file for complete search history.

(56) References Cited

U.S. PATENT DOCUMENTS

| | | | | |
|---|---|---|---|---|
| 4,135,639 A | * | 1/1979 | Dillon et al. | 220/288 |
| 4,252,246 A | * | 2/1981 | Johnson et al. | 220/288 |
| 4,588,103 A | * | 5/1986 | Baughman | 220/288 |
| 4,625,889 A | * | 12/1986 | Baughman | 220/288 |
| 4,677,730 A | * | 7/1987 | Mineo et al. | 29/512 |
| 4,950,934 A | | 8/1990 | Holly, III | |
| 5,016,775 A | * | 5/1991 | Budenbender | 220/288 |
| 5,035,266 A | | 7/1991 | Benson et al. | |
| 5,154,308 A | * | 10/1992 | Larson | 220/495.06 |
| 5,158,200 A | | 10/1992 | Vago et al. | |
| 5,305,906 A | * | 4/1994 | Dietrich et al. | 220/288 |
| 5,356,030 A | * | 10/1994 | Budenbender | 220/601 |
| 5,379,913 A | * | 1/1995 | Rieke et al. | 220/601 |
| 5,437,387 A | * | 8/1995 | Burns | 220/326 |
| 5,598,806 A | | 2/1997 | Stivers | |
| 5,816,422 A | * | 10/1998 | Roig | 215/209 |
| 5,836,048 A | | 11/1998 | Rossman et al. | |
| 5,881,907 A | * | 3/1999 | Schutz | 220/644 |
| 5,960,528 A | * | 10/1999 | Kars | 29/511 |
| 6,277,517 B1 | | 8/2001 | Thomas et al. | |
| 6,298,633 B1 | | 10/2001 | McCorkle et al. | |
| 6,362,423 B1 | | 3/2002 | Wise et al. | |
| D458,001 S | * | 5/2002 | Shah | D34/39 |
| D460,598 S | * | 7/2002 | Shah | D34/39 |
| D491,062 S | * | 6/2004 | Hoff | D9/435 |
| 6,745,914 B2 | * | 6/2004 | Hagano et al. | 220/288 |
| D539,005 S | * | 3/2007 | Baughman | D34/39 |

(Continued)

*Primary Examiner* — Joshua J Michener
*Assistant Examiner* — Alp Akbasli
(74) *Attorney, Agent, or Firm* — The Webb Law Firm (57) ABSTRACT

A fiberglass hole plug for sealing unused openings in electrical enclosures is disclosed. The hole plug includes a cover having a first side and a second side and defining a peripheral edge and a threaded member having a first end and a second end. The second end of the threaded member is attached to the second side of the cover, axially extends in a direction away from the cover, wherein a radial distance between the threaded member and the peripheral edge on the second side of said cover is less than or equal to one-half inch. The hole plug further includes a fastener threadably attached to the threaded member, whereby rotation of the fastener adjusts a longitudinal distance between the first end and the second end of the threaded member.

2 Claims, 7 Drawing Sheets

(56) References Cited

U.S. PATENT DOCUMENTS

| | | | |
|---|---|---|---|
| 8,066,139 B2* | 11/2011 | Baughman | 220/254.8 |
| 2001/0031390 A1 | 10/2001 | Schwarz | |
| 2003/0132231 A1* | 7/2003 | Van De Klippe | 220/304 |
| 2004/0083593 A1* | 5/2004 | Jackson et al. | 29/456 |
| 2004/0245252 A1* | 12/2004 | Baughman | 220/288 |
| 2004/0256393 A1* | 12/2004 | Van De Klippe et al. | 220/304 |
| 2005/0269329 A1* | 12/2005 | Baughman | 220/288 |
| 2006/0278644 A1* | 12/2006 | Baughman | 220/304 |
| 2009/0119826 A1* | 5/2009 | Coronado | 4/252.5 |

* cited by examiner

HOLE PLUG DEVICE

BACKGROUND OF THE INVENTION

Field of the Invention

This invention relates to hole plugs and, more particularly, to a fiberglass hole plug for sealing holes in electrical enclosures.

Description of Prior Art

Electrical enclosures of various sizes and shapes are used in many different applications. These enclosures are usually prefabricated with a plurality of prepositioned circular openings or holes for allowing electrical cables or wires to be installed through these openings for connection to a variety of electrical components secured within the enclosure. Depending on the type, number, and configuration of electrical components that are to be secured in the enclosure, an estimated number of openings are cut in the enclosure wall. If this estimated number of openings is high, a certain number of the openings will remain unused and exposed. Typically, it is advantageous to add additional openings for unexpected equipment or for future expansion. Electrical codes require that these unused openings be covered.

One method of covering these unused and exposed openings is the use of vinyl adhesive-backed dots which are placed over the openings. However, these vinyl adhesive-backed dots may not withstand corrosive or harsh outdoor environments where these electrical enclosures may be located. Other types of hole plugs, such as soft rubber plugs, may break down in some corrosive atmospheres because of their susceptibility to ultraviolet degradation and brittleness from extreme temperature variations. Typically, hole plugs that are able to withstand corrosive and extreme temperature variations are typically made of stainless steel, zinc plated carbon steel or painted carbon steel. However, the cost associated with these types of materials for use in the manufacture of hole plugs is expensive.

Figure 1:
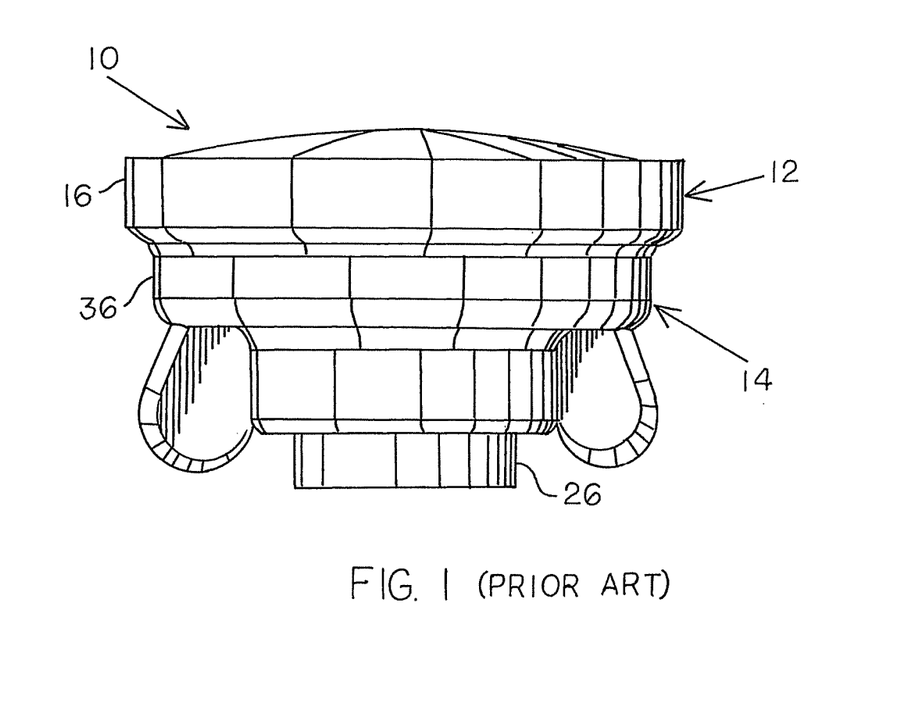
FIG. 1 is a side elevational view of a prior art fiberglass hole plug.
Figure 2:
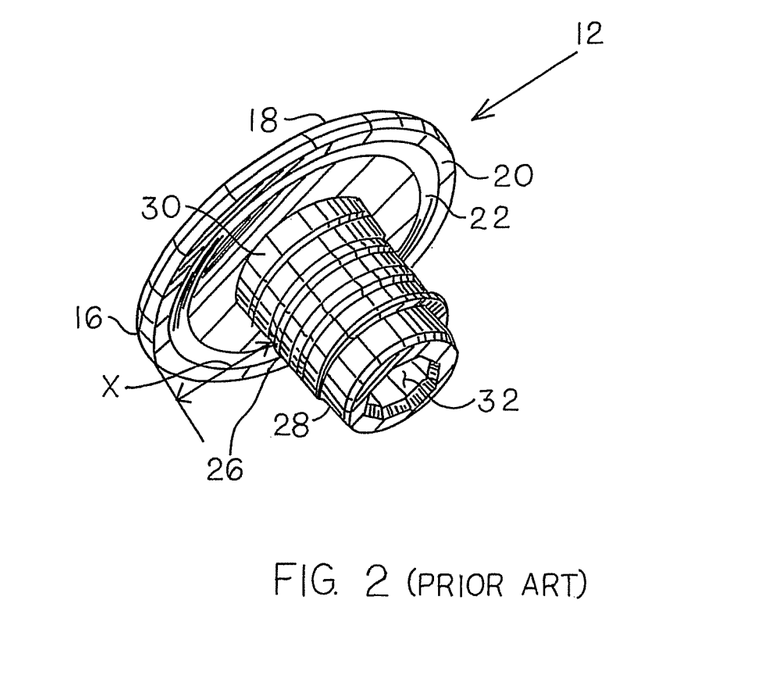
FIG. 2 is a perspective view of a first section member of the prior art fiberglass hole plug of FIG. 1.
Figure 3:
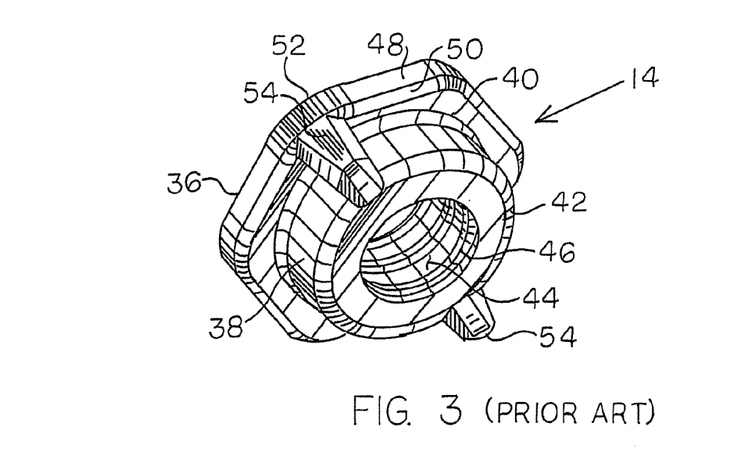
FIG. 3 is a perspective view of a second section member of the prior art fiberglass hole plug shown in FIG. 1.

One such prior art hole plug that overcomes the above deficiencies is shown in FIGS. 1-4. FIG. 1 shows a prior art hole plug 10 made of fiberglass and manufactured by Stahlin Enclosures, Inc. Referring to FIGS. 1-4, the hole plug 10 includes a first section 12 and a second section 14, wherein the first section 12 includes a cover 16 having a first side 18 and a second side 20 and a threaded member 26 having a first end 28 and a second end 30. The second end 30 of the threaded member 26 is attached to the second side 20 of the cover 16 and axially extends in a direction away from the second side 20 of the cover 16. The first side 18 of the cover 16 can be dome-shaped. A planar surface having an annular groove 22 is defined on the second side 20 of the cover 16. A center cavity 32 defined in the threaded member 26 extends from the first end 28 to the second end 30 of the threaded member 26. The second section 14 of the hole plug 10 shown in FIG. 1 includes a fastener 36 such as a nut. Referring to FIG. 3, the fastener 36 includes an annular body 38 having a first end 40 and a second end 42. An internally threaded center passageway 44 is defined in the body 38 and includes internal grooves 46 for receiving the threaded member 26 of the first section 12. The fastener 36 also includes a flange 48 having a first surface 50 and second surface 52. The first surface 50 of the flange 48 is attached to the first end 40 of the body 38. The fastener also includes a pair of tabs 54 opposed to each other and integrally attached to the first surface 50 of the flange 48 and the body 38. Each tab 54 extends from the first end 40 to the second end 42 of the body and in a radial direction away from the center passageway 44.

Figure 4:
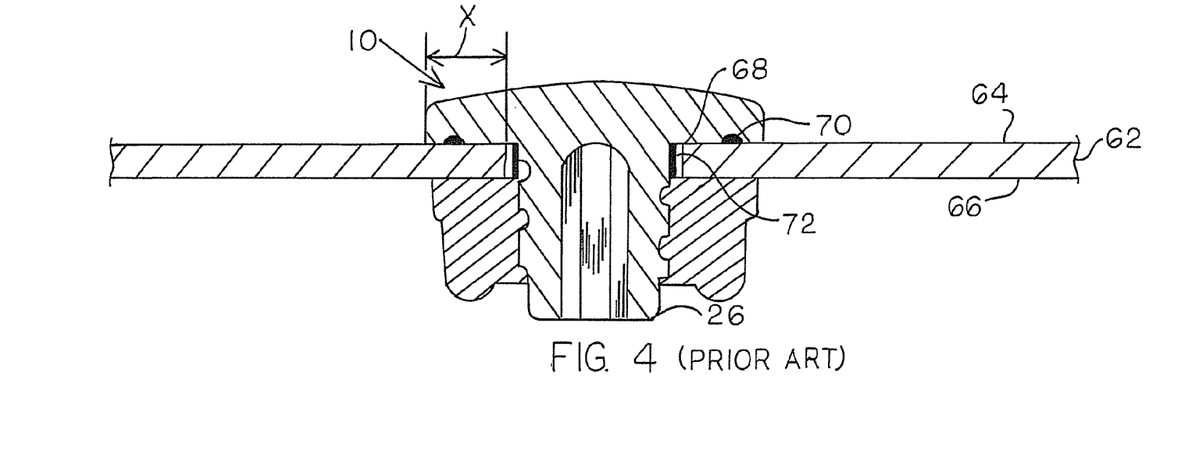
FIG. 4 is a sectional view of the prior art fiberglass hole plug shown in FIG. 1 installed in a panel wall of an enclosure.

FIG. 4 shows the prior art hole plug 10 installed in a panel wall 62 of an enclosure having an opening 68 defined therein. The threaded member 26 extends through the opening 68 and the fastener 36 threadably engages the threaded member 26, whereby rotation of the fastener 36 adjusts a longitudinal distance between the fastener 36 and the second end 30 of the threaded member 26 until the second surface 52 of the flange 48 is secured against a second surface 66 of the panel wall 62. When the fastener 36 is tightened, the second side 20 of the cover 16 engages the first surface 64 of the panel wall 62, thereby forming a seal.

However, the problem with the prior art hole plug 10 is that a specific amount of torque is oftentimes required to achieve a proper seal. To accomplish this, a custom made torque wrench has to be fabricated and used to achieve the required torque. Because hole plugs are generally installed in an enclosure that is already set up or positioned in the desired location, these custom torque wrenches are typically lost or not available. Oftentimes, these hole plugs are tightened with a user's hand during installation. Because of inconsistency in strength from one person to another, the location of the hole plug, such as being in a hard to reach place and the fatigue of a user's hand, the appropriate torque is difficult to achieve each and every time, particularly when hand tightened. Such inconsistent torque may lead to an improper seal thus drastically reducing the hole plug's sealing capabilities. This is particularly important when a large number of hole plugs are used for one enclosure, wherein even one seal failure of a hole plug can cause foreign substances such as water and/or dust to seep through thus damaging the entire contents within the enclosure.

It is, therefore, desirable to overcome the above deficiencies by providing a hole plug that can be consistently sealed properly to an enclosure when hand tightened such that the hole plug's sealing capability is drastically increased.

SUMMARY OF THE INVENTION

The present invention provides for a fiberglass hole plug for plugging a hole in a panel wall of an enclosure. The hole plug includes a cover having a first side and a second side and defining a peripheral edge and a threaded member having a first end and a second end. The second end of the threaded member is attached to the second side of the cover and axially extends in a direction away from the cover, wherein a radial distance between the threaded member and the peripheral edge on the second side of said cover is less than or equal to one-half inch. The hole plug further includes a fastener threadably attached to the threaded member, whereby rotation of the fastener adjusts a longitudinal distance between the fastener and the second end of the threaded member.

A complete understanding of the invention will be obtained from the following description when taken in connection with the accompanying drawing Figures, wherein like reference characters identify like parts throughout.

DETAILED DESCRIPTION OF THE INVENTION

Figure 5:
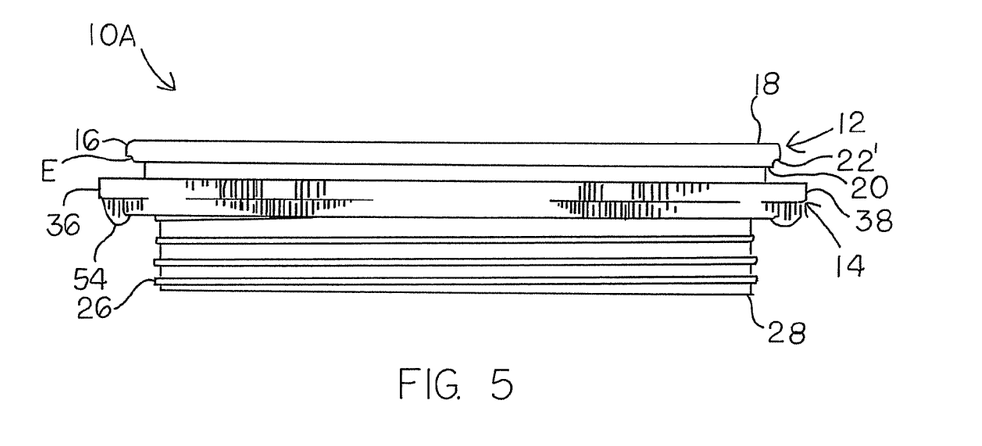
FIG. 5 is a side elevational view of a fiberglass hole plug made in accordance with the present invention.
Figure 6:
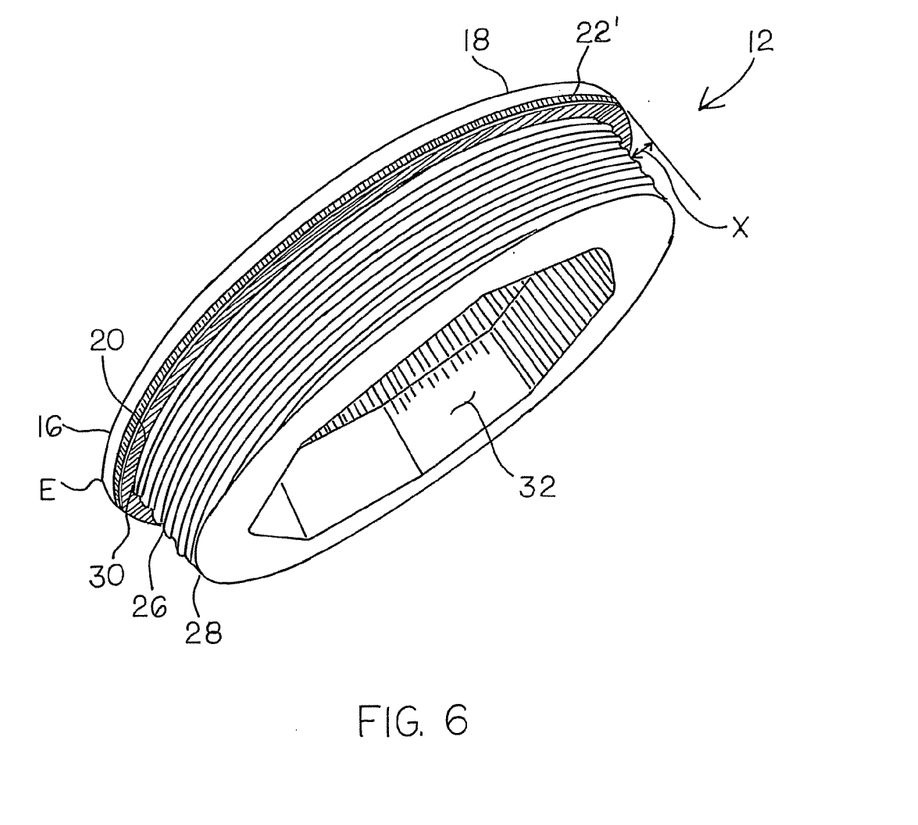
FIG. 6 is a perspective view of a first section member of the fiberglass hole plug of FIG. 5.
Figure 7:
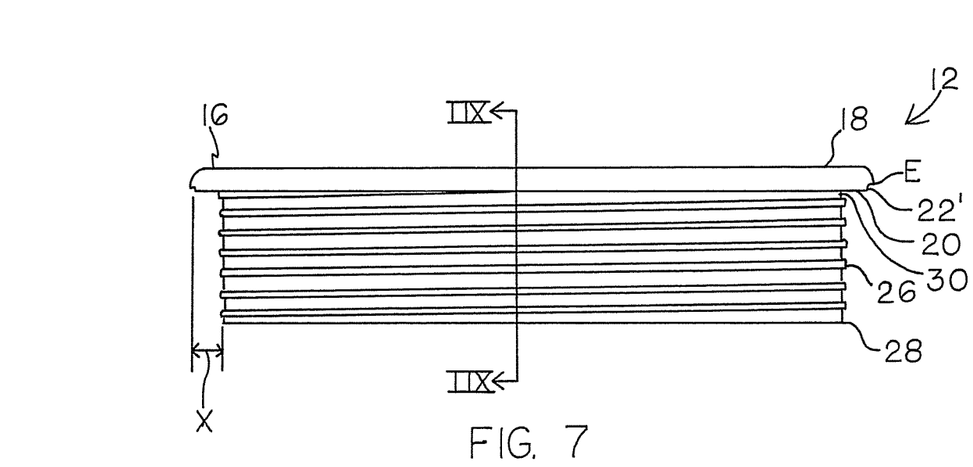
FIG. 7 is a front elevational view of the first section member of FIG. 6.
Figure 8:
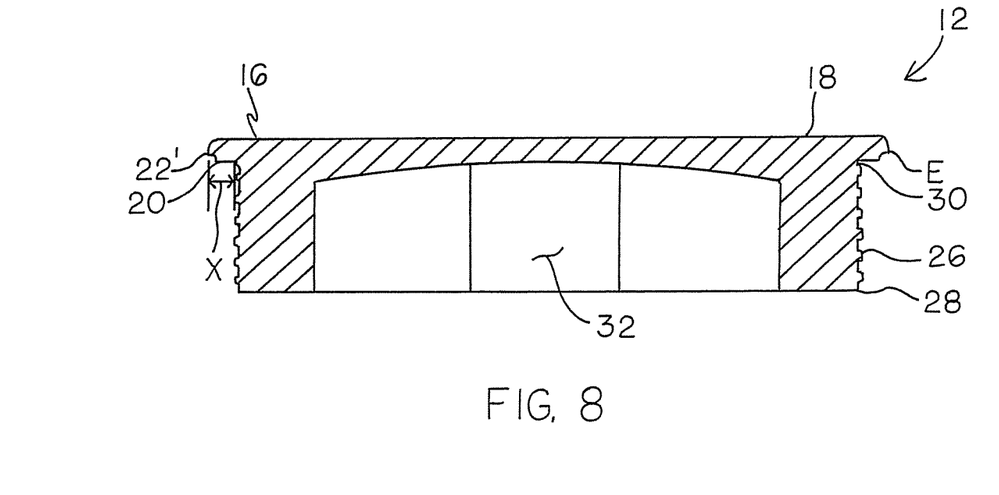
FIG. 8 is a sectional view taken along lines IIX-IIX of FIG. 7.

FIG. 5 shows a fiberglass hole plug 10A made in accordance with the present invention that is similar to prior art hole plug 10, except for the differences noted below. Like reference numerals are used for like parts. The hole plug 10A includes a first section 12 and a second section 14. The first section 12 shown in FIGS. 6-8 includes a cover 16 having a first side 18 and a second side 20 and defining a peripheral edge E, and a threaded member 26 having a first end 28 and a second end 30. The second end 30 of the threaded member 26 is attached to the second side 20 of the cover 16 and axially extends in a direction away from the second side 20 of the cover 16. The first side 18 of the cover 16 may be planar or partially dome-shaped. The second side 20 of the cover 16 has a planar surface and may include a ledge 22' defined at the peripheral edge E thereof. A center cavity 32 defined in the threaded member 26 extends from the first end 28 to the second end 30 of the threaded member 26. The cover 16 and the threaded member 26 can be formed from a unitary piece of molded fiberglass. By "fiberglass" is meant a fiberglass reinforced thermoset molding compound such as a sheet molding compound (SMC) or a bulk molding compound (BMC). SMC and BMC are well-known in the art of making reinforced molding compounds.

Figure 9:
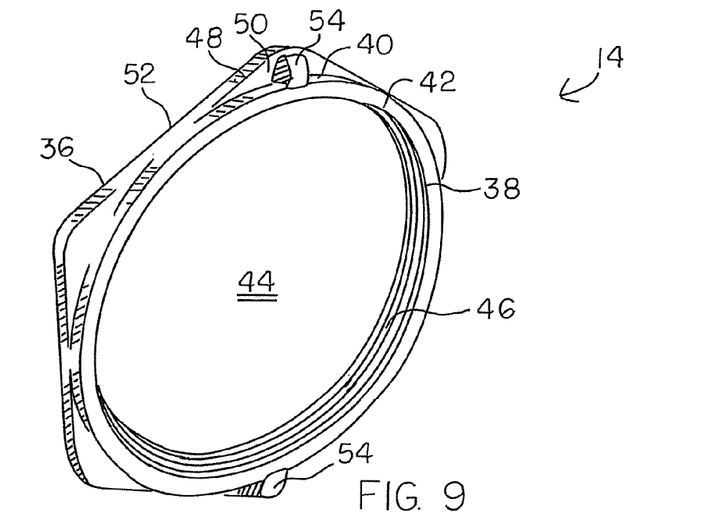
FIG. 9 is a perspective view of a second section member of the fiberglass hole plug shown in FIG. 5.
Figure 10:
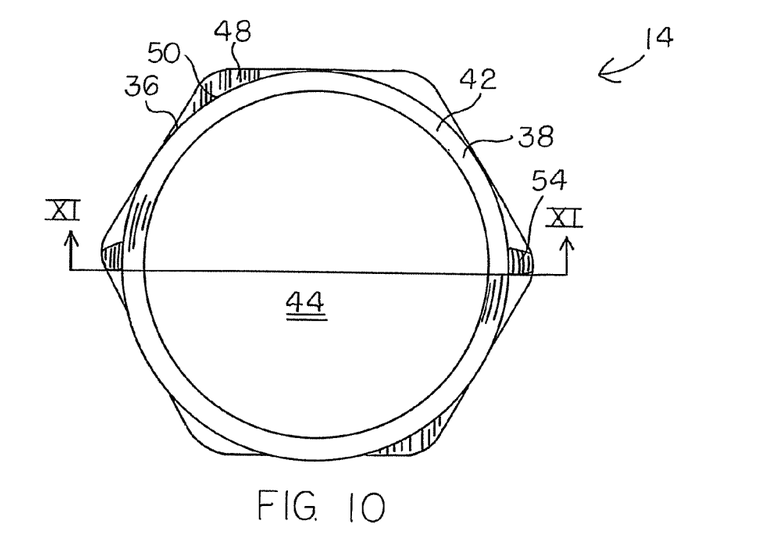
FIG. 10 is a plan view of the second section member shown in FIG. 9.
Figure 11:
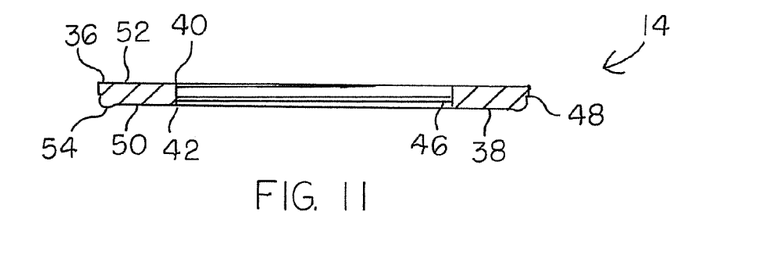
FIG. 11 is a sectional view taken along lines XI-XI of FIG. 10.

The second section 14 of the hole plug 10A shown in FIG. 5 includes a fastener 36 such as a nut. Referring to FIGS. 9-11, the fastener 36 includes an annular body 38 having a first end 40 and a second end 42. An internally threaded center passageway 44 is defined in the body 38 and includes internal grooves 46 for receiving the threaded member 26 of the first section 12. The fastener 36 also includes a flange 48 having a first surface 50 and second surface 52. The first surface 50 of the flange 48 is attached to the first end 40 of the body 38. The fastener also includes a pair of tabs 54 opposed to each other and integrally attached to the first surface 50 of the flange 48 and the body 38. The fastener 36 can be threadably attached to the threaded member 26, whereby rotation of the fastener 36 adjusts a longitudinal distance between the fastener 36 and the second end 30 of the threaded member 26. The fastener 36 can also be made of the same material as the cover 16 and the threaded member 26. Because the fastener 36 is typically on the inside of an enclosure and should not be exposed to the same external conditions as the cover 16, the fastener 36 can be made of any suitable material such as metal, plastic or rubber.

For the purposes of this specification, unless otherwise indicated, all numbers expressing size, distance, and so forth used in the specification and claims are approximations that may vary depending upon the specific size of the hole plug 10A of the present invention. One of the differences between prior art hole plug 10 and hole plug 10A is that the radial distance X between the threaded member 26 and the peripheral edge E on the second side 20 of the cover 16 (referred to as the radial lip surface) of hole plug 10A (shown in FIGS. 6-8) is less than or equal to ½-inch. Preferably, the distance of the radial lip surface X is about ¼-inch. In the prior art hole plug 10, the distance of the radial lip surface X is greater than ½-inch as shown in FIGS. 2 and 4. As will be discussed later, it has been shown that the hole plug 10A having less radial lip surface X available to contact an outer surface of a panel wall results in a substantial improvement in sealing capabilities when hand tightened in contrast to the sealing capabilities of the prior art hole plug 10.

Figure 12:
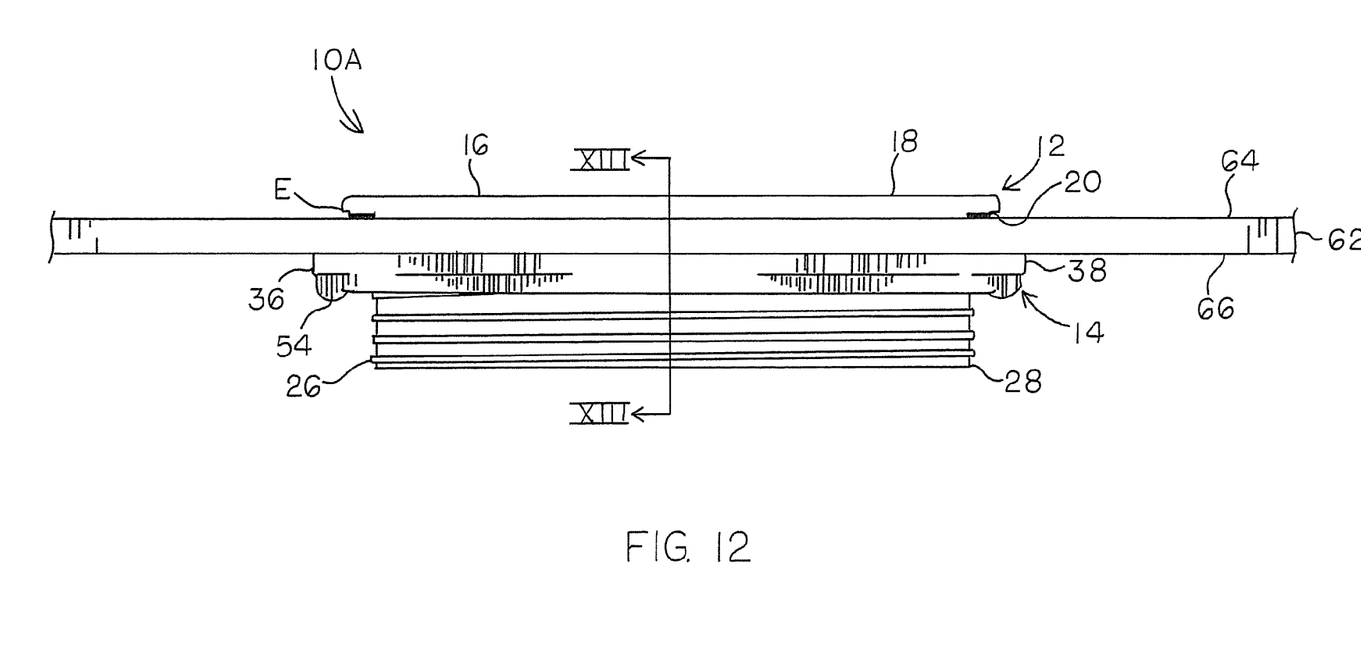
FIG. 12 is an elevational view of the fiberglass hole plug shown in FIG. 5 installed in a panel wall of an enclosure.
Figure 13:
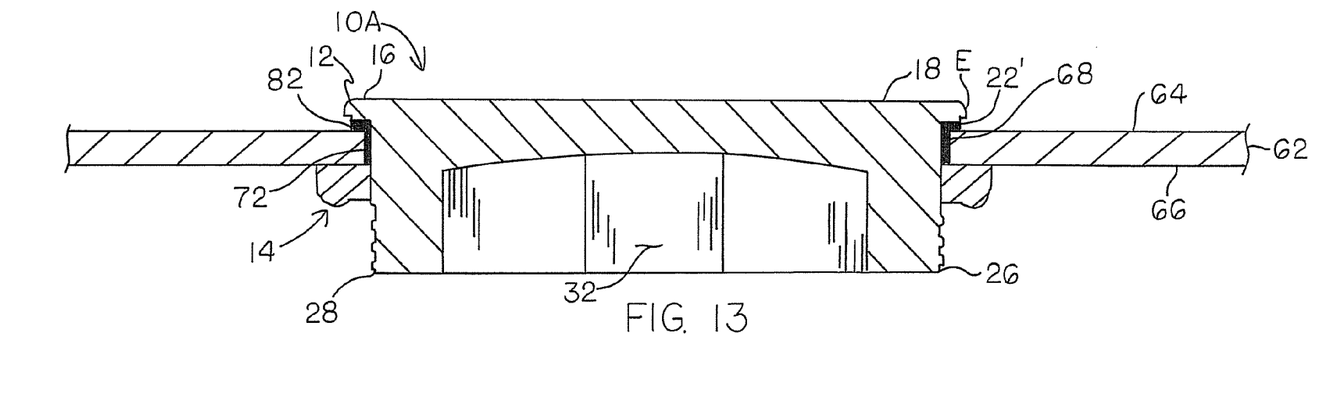
FIG. 13 is a sectional view taken along lines XIII-XIII of FIG. 12.
Figure 14:
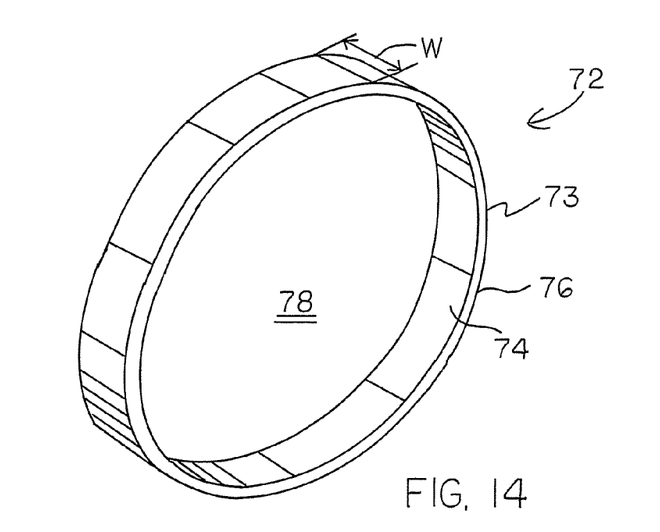
FIG. 14 is a perspective view of a spacer shown in FIG. 13.

Referring to FIGS. 12 and 13, the diameter of the threaded member 26 of hole plug 10A is such that the threaded member 26 fits snugly into a hole or opening 68 of a panel wall 62. For example, the threaded member 26 of the hole plug 10A may be substantially equal to or slightly less than the diameter of the opening 68 in the panel wall 62 such that the threaded member 26 slidably abuts against the side walls thereof. If the opening 68 in the panel wall is greater than the diameter of the threaded member 26, a spacer 72 (shown in phantom in FIG. 13) may be inserted onto the threaded member 26 in order to provide a snug fit. Referring to FIG. 14, the spacer 72 includes a body 73 having an inner surface 74 and an outer surface 76 and defining a center aperture 78. The spacer 72 is preferably of a width W essentially equal to the thickness of the panel wall 62 and has a diameter of slightly less than the diameter of the opening 68 in the panel wall 62. The thickness of the spacer is preferably about ⅛-inch thick. For example, if the threaded member 26 is about ⅛-inch less than the diameter of the opening 68, the spacer 72 having a thickness of about ⅛-inch is inserted thereon to provide a snug fit for installation and alignment of the hole plug 10A.

In the prior art hole plug 10, the distance of the radial lip surface X is typically greater than ½-inch as shown in FIGS. 2 and 4. This is due to the fact that one prior art hole plug 10 is designed to accommodate a greater diameter range of openings or holes 68 in a panel wall 62 in contrast to the hole plug 10A of the present invention. For example, a prior art hole plug 10 having a 3-inch diameter cover and a 1.5-inch diameter threaded member has a radial lip surface X of ¾-inch. This 3-inch hole plug 10 can typically plug holes 68 ranging from slightly greater than 1.5-inches (e.g., 1.53 inches) in diameter to slightly less than 3-inches (e.g., 2.97 inches). In contrast, as shown below in Table 1, a similar size hole plug 10A (e.g., size 4) of the present invention has a 3.38 inch diameter cover 16, a 2.97-inch diameter threaded member 26 and a radial lip surface X of slightly less than ¼ inch (i.e., 0.21 inch). A size 4 hole plug 10A can cover holes ranging from 2.00 inches to 2.12 inches in diameter, which is significantly less than the prior art hole plug 10. If the hole diameter is at an upper range, for example about 2.12 inches, a spacer 72 having a thickness of ⅛-inch may be use in conjunction with hole plug 10A to provide a snug fit as shown in FIG. 13.

Table 1 shows a general guide range for various size hole plugs 10A, wherein the distance of the radial lip surface X is less than or equal to ½-inch.

TABLE 1

| Example Size | Dia. of cover | Dia. Of threaded member | Hole Diameter Range | Distance of radial lip surface (X) | Spacer may be used |
| --- | --- | --- | --- | --- | --- |
| 1 | 1.00" | 0.44" | 0.50" to 0.56" | 0.28" | Yes |
| 2 | 1.50" | 0.85" | 0.88" to 1.00" | 0.33" | Yes |
| 3 | 2.00" | 1.35" | 1.38" to 1.50" | 0.33" | Yes |
| 4 | 2.75" | 1.97" | 2.00" to 2.12" | 0.39" | Yes |
| 5 | 3.38" | 2.97 | 3.00" | 0.21" | N/A |
| 6 | 4.00" | 3.59" | 3.62" | 0.21" | N/A |
| 7 | 4.50" | 4.09" | 4.12" | 0.21" | N/A |
| 8 | 5.00" | 4.59" | 4.62" | 0.21" | N/A |

FIG. 13 show a fiberglass hole plug 10A and an annular gasket 82 provided thereon. The gasket 82 such as a flat gasket is positioned between the second side 20 of the cover 16 and the first surface 64 of the panel wall 62 thus providing a seal between the cover 16 and the panel wall 62. The gasket 82 preferably covers the entire second side 20 of the cover 16. In the prior art hole plug 10, an O-ring 70 covers a portion of the second side 20 of the cover 16 as shown in FIG. 4. The gasket 82 can be made of an elastomeric material such as rubber or neoprene or a foam material such as ethylene propylene diene monomer (EPDM) or silicone.

Referring to FIGS. 12 and 13, the present invention provides for a method of plugging a hole in a panel and includes the steps of providing a fiberglass hole plug 10A as previously discussed. Second, a gasket 82 is inserted over the threaded member and fitted on the second side of the cover 16. Third, the first end 28 of the threaded member 26 is inserted through the opening 68 in the panel wall 62 and the fastener 36 is fastened onto the first end 28 of the threaded member 26. The fastener 36 threadably engages the threaded member 26 and is rotated a longitudinal distance towards the second end 30 of the threaded member 26 until the second surface 52 of the flange 48 is secured against the second surface 66 of the panel wall 62. When the fastener 36 is tightened, the gasket 82 engages the first surface 64 of the panel wall 62, thereby forming a seal with the gasket 82. A spacer 72 can be inserted into the opening 68 prior to inserting the threaded member 26 through the opening 68 in the panel wall 62.

Because it is known in the industry that a person using hole plug devices in the field to plug an enclosure will oftentimes use their hand to tighten the device, hand tightening of these devices typically results in inconsistent torque applied thereto, thus resulting in an improper seal. Depending on the size of the hole plug 10A, the amount of torque required for a proper seal may vary. For example, size 1 and 2 hole plugs 10A require 1.0 ft-lbs of torque; size 3 and 4 require 2.0 ft-lbs of torque; and size 5 to 8 require 3.0 ft-lbs of torque. However, when the hole plugs 10 and 10A are loosely tightened to approximately one-half of the required torque, the sealing capabilities of hole plug 10A are substantially better than the sealing capabilities of the prior art hole plug 10 when loosely tightened.

The following Example shows comparative seal tests performed on hole plugs 10A of the present invention and the corresponding size prior art hole plug 10.

EXAMPLES

In Example 1 and Comparative Example 1A, a size 8 hole plug 10A (see Table 1) and corresponding size (e.g., 4.5") prior art hole plug 10 were installed in an opening of an enclosure. The prior art hole plug 10 used an O-ring 70 on the second surface 20 of the cover and hole plug 10A used gasket 82 thereon. The hole plugs 10 and 10A were tightened to one-half the required torque, for example 1.5 ft-lbs, using a torque wrench. The tightening to one-half of the require torque simulates a loosely hand tightened hole plug. The following submersion test was conducted.

In the submersion test, each of the sample enclosures was placed in a tank. The tank was filed with water so that the highest point on the enclosures was 6 feet below the surface of the water. After 24 hours, the enclosures were removed from the tank. The excess water was removed from the exterior surface of the enclosures, and both of the enclosures were opened and visibly inspected for water or moisture. If moisture or water was detected within the enclosure, the hole plug leaked or failed. The results of this test are shown below in Table 2.

TABLE 2

| Hole plug | Submerging Test |
| --- | --- |
| Example 1 Size 8 (Hole plug 10A) | PASSED |
| Comparative Example 1A (Hole plug 10) | FAILED |

As shown in Comparative Examples 1A and 2A of Table 2, the prior art hole plug 10 failed the submersion test when loosely tightened to one-half of the required torque. It is believed that the combination of the gasket 82 covering the entire surface on the second side 20 of the cover 16 and the minimal radial lip surface X available to contact the surface 64 of the panel wall 62 of the hole plug 10 contributes substantially to the improvements in the sealing capabilities in contrast to the prior art hole plug 10 as shown in Example 1.

While specific embodiments of the invention have been described in detail, it will be appreciated by those skilled in the art that various modifications and alternatives to those details could be developed in light of the overall teachings of the disclosure. The presently preferred embodiments described herein are meant to be illustrative only and not limiting as to the scope of the invention which is to be given the full breadth of the appended claims and any and all equivalents thereof.

The invention claimed is:

1. A hole plug for plugging a hole in a panel, said hole plug comprising:
a cover having a first side and a second side and defining a peripheral edge;
a threaded member having a first end and a second end, said second end of said threaded member attached to said second side of said cover and axially extending in a direction away from said cover, wherein a radial distance between said threaded member and the peripheral edge on said second side of said cover is less than or equal to one-half inch; and
a fastener threadably attached to said threaded member, whereby rotation of said fastener adjusts a longitudinal distance between said fastener and said second end of said threaded member, said fastener comprising;
an annular body having a first end and a second end, said body defining an internally threaded center passageway for receiving said threaded member;

a flange having a first surface and a second surface, said first surface of said flange attached to said second end of said body; and a pair of tabs opposed to each other and integrally attached to both said first surface of said flange and said body, said tabs extending from said first end to said second end of said body and extending radially in a direction away from said center passageway.

2. A hole plug assembly for plugging a hole in a panel, said assembly comprising: a cover having a first side and a second side and defining a peripheral edge, a threaded member having a first end and a second end, said second end of said threaded member attached to said second side of said cover and axially extending in a direction away from said cover, wherein a radial distance between said threaded member and the peripheral edge on said second side of said cover is less than or equal to one-half inch, a fastener threadably attached to said threaded member, whereby rotation of said fastener adjusts a longitudinal distance between said fastener and said second end of said threaded member, said fastener comprising an annular body having a first end and a second end, said body defining an internally threaded center passageway for receiving said threaded member; a flange having a first surface and a second surface, said first surface of said flange attached to said second end of said body; and a pair of tabs opposed to each other and integrally attached to both said first surface of said flange and said body, said tabs extending from said first end to said second end of said body and extending radially in a direction away from said center passageway; and a gasket positioned on said second side of said cover, wherein said gasket is adapted to provide a seal between said second side of said cover and a panel wall.

* * * * *